United States Patent [19]

Embree et al.

[11] Patent Number: 4,720,643
[45] Date of Patent: Jan. 19, 1988

[54] PEAK CATCHER CIRCUIT

[75] Inventors: Milton L. Embree, Reading; Robert F. Lee, Wyomissing, both of Pa.

[73] Assignee: American Telephone and Telegraph Company, AT&T Bell Laboratories, Murray Hill, N.J.

[21] Appl. No.: 54,072

[22] Filed: May 15, 1987

Related U.S. Application Data

[63] Continuation of Ser. No. 310,609, Oct. 13, 1981, abandoned.

[51] Int. Cl.⁴ .................. H03K 5/153; G11C 27/00; G01R 19/04
[52] U.S. Cl. .................................. 307/351; 307/359
[58] Field of Search ............... 307/351, 353, 359; 328/151; 324/103 P

[56] References Cited

U.S. PATENT DOCUMENTS

| | | | |
|---|---|---|---|
| 3,413,491 | 11/1968 | Reeves et al. | 307/235 |
| 3,596,109 | 7/1971 | Marshall | 307/235 |
| 3,643,110 | 2/1972 | Thompson | 307/353 |
| 3,702,942 | 11/1972 | Aguirre | 307/352 |
| 4,163,909 | 8/1979 | Harr | 307/351 |
| 4,321,488 | 3/1982 | Srivastava | 307/351 |

*Primary Examiner*—John Zazworsky
*Attorney, Agent, or Firm*—James H. Fox

[57] ABSTRACT

A peak catcher circuit comprises an input differential amplifying circuit consisting of a pair of transistors. An input signal in the form of an electrical wave or pulse is applied between the base of the first transistor of the pair and a point of fixed potential, while a capacitor is connected between the base of the second transistor of the pair and the fixed potential. A first fixed current source is connected between the coupled emitters of the differential pair and the fixed potential, and a second smaller fixed current source is connected between the collector of the second transistor and a second fixed potential. A second pair of oppositely poled emitter-coupled, common base connected transistors is connected between the base of the second transistor of the differential pair and the second fixed potential, and there is a connection from the coupled emitters of the second pair to the collector of the second transistor of the differential pair. One transistor of the second pair having its collector connected to one side of the capacitor acts as a switch to provide charging current to the capacitor when the input voltage at the base of the first transistor of the differential pair is higher than the voltage across the capacitor, which is the same as the voltage at the base of the second transistor of the differential pair. The other transistor of the second pair acts as a voltage limiter for the collector voltage of the second transistor of the differential pair. It prevents saturation of that transistor and also reduces the voltage swing at the collector of the same transistor. This greatly improves circuit speed and prevents large errors which would occur for input voltage peaks of short duration.

9 Claims, 4 Drawing Figures

PEAK CATCHER CIRCUIT

This application is a continuation of application Ser. No. 310,609, filed Oct. 13, 1981, now abandoned.

BACKGROUND OF THE INVENTION

This invention relates to a circuit for capturing the peak value of an electrical wave or pulse and more particularly, to a semiconductor integrated circuit for accomplishing this function.

There is a need for a relatively simple, high-speed circuit which captures and holds the peak value to which a wave or pulse rises. Electronic circuits for detecting peak values are previously known. An important aspect of most such circuits is their speed of response in terms of the duration of time in which the pulse or wave magnitude is observed and stored. In another aspect, the preciseness of such a circuit is a function of the speed with which the detection window is closed as the peak is passed.

For example, in the circuit disclosed in U.S. Pat. No. 3,413,491 to Reeves et al, a peak holder utilizes a pair of amplifiers and a blocking diode. This circuit, although functioning as designed, by virtue of its input configuration and feedback arrangement is not as fast as required by many present applications. In particular, the preamplifier requires a considerable slewing to accomplish both forward and reverse biasing of the blocking diode. The circuit therefore lacks the preciseness and speed of the peak catching function desired for many applications. Another type of peak detecting circuit is disclosed in U.S. Pat. No. 4,163,909 to J. D. Harr. In this patent, a circuit is disclosed for detecting the timing of the peak rather than its magnitude.

Accordingly, an object of this invention is a peak catcher circuit which captures the peak of a wave or pulse with preciseness and minimum overshoot. Precise turn-on is also important for accuracy in certain applications.

SUMMARY OF THE INVENTION

In accordance with one embodiment, a peak catcher circuit includes an input differential amplifying circuit comprising first and second differentially connected transistors. An input signal in the form of a wave or pulse is applied between the base of the first transistor and a first fixed potential level, and a capacitor is connected between the base of the second transistor and the first fixed potential. A first fixed current source is connected between the coupled emitters of the differential pair and the first fixed potential. A second smaller fixed current source is connected between the collector of the second transistor of the differential pair and a second fixed potential. A second pair of oppositely poled transistors having their emitters connected together are serially connected, collector-to-emitter and emitter-to-collector, between the base of the second transistor of the differential pair and the second fixed potential.

This second pair of transistors operates in the common base mode and constitutes a switching element or means for steering charging current. In particular, the transistor of the second pair having its collector connected to the base of the second transistor of the differential pair, which is the circuit output node, acts as a switch to provide charging current to the capacitor when the input voltage at the base of the first transistor of the differential pair is higher than the voltage across the capacitor. When the voltage across the capacitor is the same as the voltage at the base of the first transistor of the differential pair, the charging current is zero.

The other transistor of the second pair having its collector connected to the second fixed potential level acts as a voltage limiter for the collector voltage of the second transistor of the differential pair. It not only prevents the saturation of that transistor, but also reduces the voltage swing at the node between that collector and the second fixed current source. Thus, in effect, the second pair of transistors constitutes a uniquely advantageous switching element for directing charging current to the storage element during a period as defined by the difference between the input signal voltage and the capacitor voltage.

This second pair of transistors is appropriately biased to accomplish this function and typically has base bias voltages differing by the amount of the voltage across one base-emitter junction. This configuration greatly improves circuit speed and prevents large errors which otherwise would occur for input voltage peaks of short duration.

BRIEF DESCRIPTION OF THE DRAWINGS

The invention and its other objects and features will be more clearly understood when taken in conjunction with the drawings in which.

DETAILED DESCRIPTION

Figure 1:
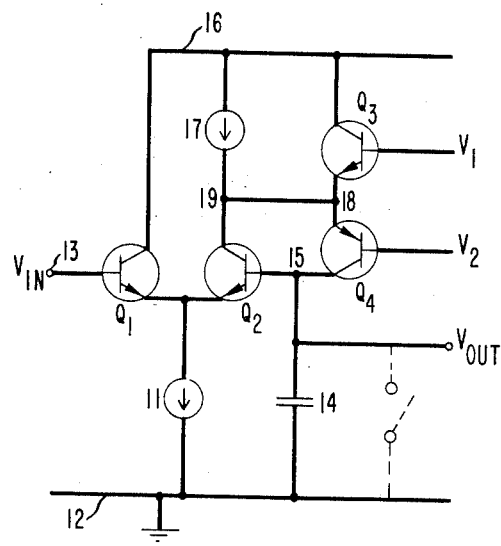
FIG. 1 is a circuit schematic of a basic embodiment of the invention.

Referring to FIG. 1, NPN transistors $Q_1$ and $Q_2$ are connected as a differential pair having a fixed current source 11 connected between the interconnected emitters and a first fixed potential level 12. The level 12 may be ground or other appropriate potential level. The input signal pulse is applied at the input terminal 13 which is connected to the base of the first transistor $Q_1$ of the differential pair. A charge storage device in the form of capacitor 14 is connected between output terminal 15 and the first fixed potential level 12. Output terminal 15 also is connected to the base of the second transistor $Q_2$. The collectors of the first and second transistors of the differential pair are connected to a second fixed potential level 16 which, in the case of the second transistor $Q_2$, includes a second fixed current source 17.

NPN transistor $Q_3$ and PNP transistor $Q_4$ are connected in a common base configuration. The interconnected emitters of this second pair, $Q_3$ and $Q_4$ are connected by way of common node 18-19 to the collector of the second transistor $Q_2$ of the differential pair and the second fixed current source 17. The base of transistor $Q_3$ is maintained at a fixed potential $V_1$, and the base of transistor $Q_4$ is maintained at a fixed potential $V_2$, smaller than $V_1$. This second pair of complementary transistors, $Q_3$ and $Q_4$, functions as a switching element to provide current flow from node 19-18 to node 15 by way of transistor $Q_4$, or to node 18-19 through transistor $Q_3$ from potential level 16.

In a specific embodiment, the first current source 11 supplies a current I, and the second current source 17 a current I/2. When the potential $V_{IN}$ at input terminal 13 is equal to the potential at output terminal 15, the collector currents of transistors $Q_1$ and $Q_2$, and the current of source 17 all are equal. Under this condition, transistors $Q_3$ and $Q_4$ are both nonconducting (OFF). The voltage difference between their bases, $V_1$-$V_2$, is set to about 0.8 volt so that the base-emitter junction of each transistor can be forward biased, but not by an amount sufficient to turn transistors $Q_3$ and $Q_4$ ON when the collector current of transistor $Q_2$ and the current source 17 are equal. It is important that the base bias voltages differ by less than double the nominal voltage drop of one base-emitter junction to ensure that $Q_3$ and $Q_4$ will not be ON at the same time. Both transistors may be OFF simultaneously.

When the input voltage $V_{IN}$ increases so as to make transistor $Q_1$ more conducting than transistor $Q_2$, the collector current of transistor $Q_2$ becomes less than I/2, transistor $Q_4$ turns ON and provides charging current to capacitor 14. This charging current is approximately equal to the difference between that of the fixed current source 17 and the collector current of transistor $Q_2$.

When the voltage across the capacitor 14 equals the voltage of the input, $V_{IN}$, transistors $Q_1$ and $Q_2$ operate at equal current again, the voltage at the collector of transistor $Q_2$ decreases, and transistor $Q_4$ turns OFF, and there is no charging current to capacitor 14.

When the input voltage, $V_{IN}$, decreases, the current through transistor $Q_2$ increases, and the voltage at its collector decreases. When this occurs, transistor $Q_3$ turns ON and supplies the additional current required by current source 11.

Thus, transistor $Q_3$ acts as a voltage limiter for the collector voltage of transistor $Q_2$. It not only prevents saturation of transistor $Q_2$ but reduces the voltage swing at node 19. The effect is to greatly improve circuit speed and to enable accurate detection of input voltage peaks of short duration.

The stored charge representative of a peak is the voltage across the capacitor 14. This voltage is detected and transmitted by suitable means not shown. That output signal is susceptible of a variety of uses which are not part of this invention.

Figure 2:
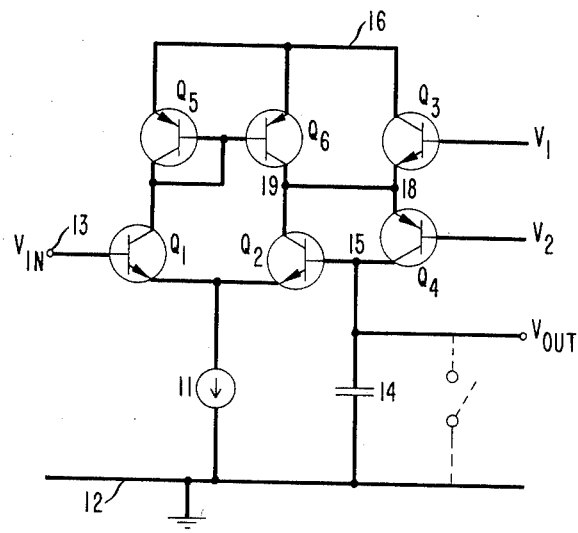
FIG. 2 is a similar configuration utilizing a current mirror in place of a constant current generator.

In the embodiment of FIG. 2 in which elements corresponding to those appearing in FIG. 1 are similarly identified, the second fixed current source 17 of FIG. 1 has been replaced by a current mirror consisting of transistor $Q_6$ and diode-connected transistor $Q_5$. As compared to the embodiment of FIG. 1, this circuit has the advantage that twice as much current is available to charge the capacitor 14.

Figure 3:
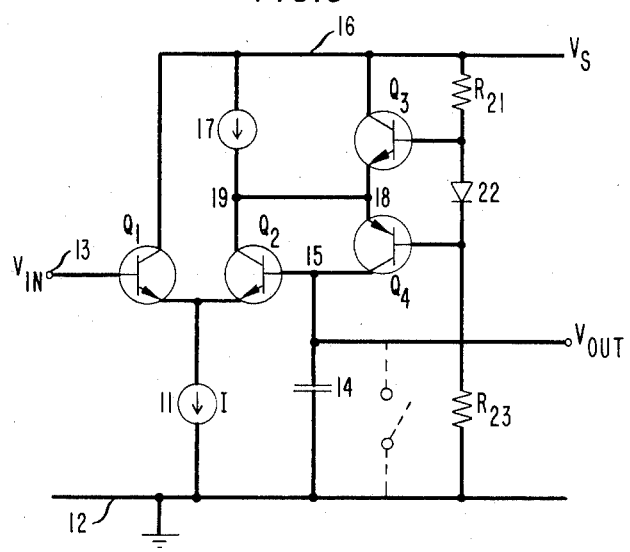
FIG. 3 is a further variation using a diode bias for the second pair of transistors to improve temperature compensation.

The embodiment of FIG. 3 differs from the basic embodiment of FIG. 1 in that diode 22 in combination with resistors 21 and 23 serves as a voltage divider between fixed voltage bus 16 and 12 and provides the bias $V_1$ and $V_2$ for the bases of transistors $Q_3$ and $Q_4$. In FIG. 3, as in FIG. 2, elements corresponding to those appearing in the basic embodiment of FIG. 1 have the same reference characters or numerals. This practice also is continued in FIG. 4 described hereinafter. This circuit arrangement of FIG. 3 tends to temperature compensate the base bias voltages and thus enables a circuit having somewhat faster switching response.

Figure 4:
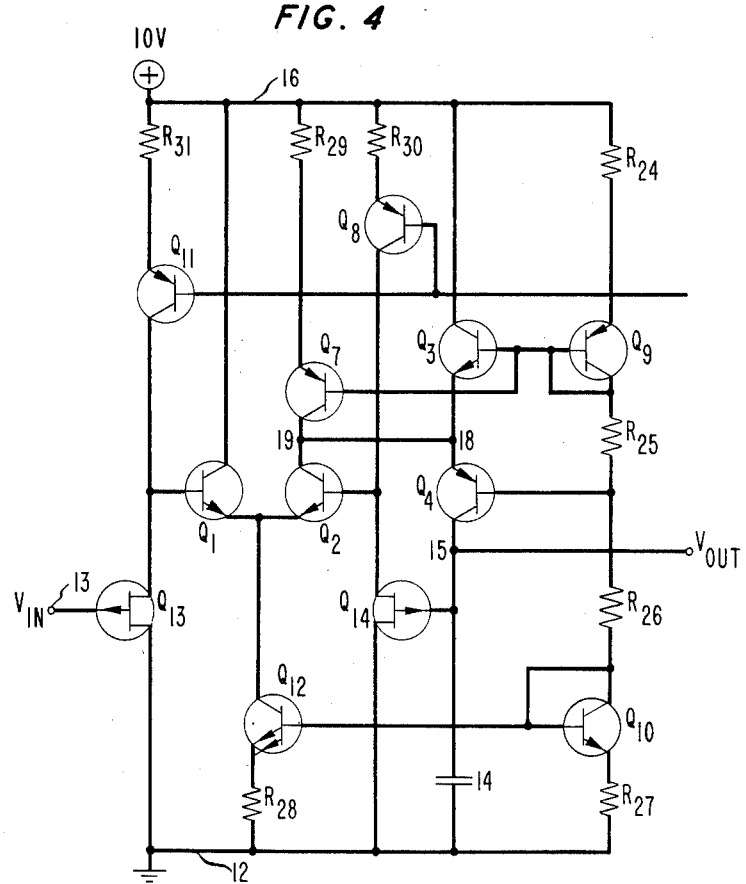
FIG. 4 is a more complete embodiment including field effect transistors to inhibit charge leakage.

The specific embodiment of FIG. 4 depicts an optimized integrated circuit form of the basic peak catcher circuit. In addition to the basic circuit embodiment of FIG. 1, which is a part of the embodiment of FIG. 4, this embodiment is modified and refined in certain respects. The basic circuit comprises the differential pair of transistors $Q_1$ and $Q_2$, the pair of switching transistors $Q_3$ and $Q_4$, and the storage device represented by capacitor 14.

In order to increase the input and output impedance of the basic circuit, transistors $Q_{13}$ and $Q_{14}$ which are of the field effect type have been placed in the input and output, respectively. By thus increasing the impedance, greater assurance is provided against discharge of the capacitor 14 during the holding period of the circuit.

The fixed current sources 11 and 17 of the embodiment of FIG. 1 have been realized by an arrangement comprising two current mirrors consisting essentially of transistors $Q_7$ and $Q_9$, and transistors $Q_{12}$ and $Q_{10}$. The righthand-most voltage divider circuit extending from the second fixed voltage level 16 to the first fixed voltage level 12 and including resistors R24, R25, R26, and R27 carries a current determined by the value of those resistors and the voltage drops incurred by diode-connected transistors $Q_9$ and $Q_{10}$. This current is mirrored in the collector circuit of transistor $Q_2$ at node 18-19 by the pairing of transistors $Q_7$ and $Q_9$. Twice the value of this current is produced in the collector circuit of transistor $Q_{12}$ by the current mirror consisting of diode-connected transistor $Q_{10}$ and the double emitter transistor $Q_{12}$.

In a specific embodiment in which the supply voltage at fixed voltage level 16 is +10 volts and fixed voltage level 12 is ground, resistors R24 and R27 are 1,000 ohms, resistor R25 is 2,140 ohms, and resistor R26 is 16,860 ohms. For these values, the voltage drop between the bases of transistors $Q_3$ and $Q_4$ is approximately 0.9 volts, which is less than the two $V_{BE}$ criterion for operation of these switching transistors.

Transistors $Q_8$ and $Q_{11}$ and resistors R30 and R31 constitute current sources for biasing the source follower FET transistors $Q_{13}$ and $Q_{14}$. Resistors R28 and R29 are needed for emitter degeneration.

Additional alternative embodiments may be devised. For example, the current mirror of the embodiment of FIG. 2 may be added to the embodiment of FIG. 4.

What is claimed is:

1. A circuit for capturing and presenting the peak value of a signal during a holding period, said circuit comprising first and second transistors connected as a differential pair having a signal input terminal connected to the control electrode of the first transistor, and a signal output terminal connected to the control electrode of the second transistor, wherein a first fixed current means produces a first current between the commonly connected first controlled electrodes of said transistors and a first voltage level terminal, and a second fixed current means produces a second current between the second controlled electrode of the second transistor and a second voltage level terminal, and further comprising a capacitor connected between the signal output terminal and the first voltage level terminal, characterized in that a current switching means is connected between the second voltage level terminal and the signal output terminal, wherein the current switching means comprises a pair of complementary transistors connected one on each side of an intermediate connection to the second controlled electrode of the second transistor, and is responsive to the relative voltage levels at the signal input and output terminals for conducting the difference in current between the second fixed current means and the current in the second controlled electrode of the second transistor to the capacitor when said difference in current is positive, and not conducting said difference in current to the storage device when said difference in current is negative.

2. The circuit of claim 1 wherein said complementary transistors have their control electrodes connected to separate bias voltages.

3. The circuit of claim 1 wherein one of said complementary transistors has a voltage on its control electrode that is a diode voltage drop less than the voltage on the control electrode of the other one of said complementary transistors.

4. The claim 1 wherein said first and second fixed current means are fixed current sources.

5. The circuit of claim 1 wherein said first fixed current means is a current source, and said second fixed current means comprises a transistor and a diode-connected transistor forming a current mirror.

6. The circuit of claim 1 wherein the first and second fixed current means comprise a pair of current mirrors.

7. A circuit for capturing and presenting the peak value of a signal pulse comprising a first voltage level terminal, a second voltage level terminal, a signal input terminal, a signal output terminal, first and second constant current sources producing first and second currents, respectively, first and second transistors connected to form an emitter-coupled differential pair, third and fourth opposite polarity transistors having their emitters connected, the signal input terminal is connected to the base of the first transistor, the signal output terminal is connected to the base of the second transistor, the first current source is connected between the coupled emitters of the first and second transistors and the second voltage level terminal, the collector of the first transistor is connected to the first voltage level terminal, the second current source is connected between the collector of the second transistor and the first voltage level terminal, the collector of the third transistor is connected to the first voltage level terminal, the collector of the fourth transistor is connected to the signal output terminal, a capacitor connected between the signal output terminal and the second voltage level terminal, a first node between the second current source and the collector of the second transistor, a second node between the interconnected emitters of the third and fourth transistors, means interconnecting the first and second nodes, the base of the third transistor having a voltage $V_1$ applied thereto, such that the magnitude of the voltage at the first node is limited, thereby preventing saturation of the second transistor, the base of the fourth transistor having a voltage $V_2$ applied thereto, such that the fourth transistor conducts when the signal voltage at the input terminal is greater than the voltage at the output terminal, whereby charging current is supplied to charge the capacitor, and said first current is greater than said second current.

8. The circuit in accordance with claim 7 in which the difference between voltage $V_1$ and voltage $V_2$ is less than twice the voltage drop across one base-emitter junction.

9. The circuit in accordance with claim 7 in which said first current is equal to twice said second current.

* * * * *